(12) United States Patent
Lim et al.

(10) Patent No.: US 6,613,652 B2
(45) Date of Patent: *Sep. 2, 2003

(54) METHOD FOR FABRICATING SOI DEVICES WITH OPTION OF INCORPORATING AIR-GAP FEATURE FOR BETTER INSULATION AND PERFORMANCE

(75) Inventors: Yeow Kheng Lim, Singapore (SG); Randall Cher Liang Cha, Singapore (SG); Alex See, Singapore (SG); Tae Jong Lee, Orlando, FL (US); Wang Ling Goh, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 64 days.

This patent is subject to a terminal disclaimer.

(21) Appl. No.: 09/805,707

(22) Filed: Mar. 14, 2001

(65) Prior Publication Data

US 2002/0132448 A1 Sep. 19, 2002

(51) Int. Cl.[7] .......................... H01L 21/30; H01L 21/46
(52) U.S. Cl. .................. 438/459; 438/311; 438/406; 438/455; 438/456
(58) Field of Search ............................... 438/406, 411, 438/412, 421, 455, 456, 458, 459, 977, 311, 318, 319; 148/DIG. 12, DIG. 135, DIG. 150; 257/506, 524

(56) References Cited

U.S. PATENT DOCUMENTS

| 4,169,000 A | | 9/1979 | Riseman | 438/422 |
|---|---|---|---|---|
| 4,851,078 A | * | 7/1989 | Short et al. | 438/406 |
| 5,374,564 A | * | 12/1994 | Bruel | 438/455 |
| 5,484,738 A | | 1/1996 | Chu et al. | 438/152 |
| 5,773,352 A | * | 6/1998 | Hamajima | 438/406 |
| 5,804,086 A | * | 9/1998 | Bruel | 216/33 |
| 5,882,987 A | * | 3/1999 | Srikrishnan | 438/458 |
| 5,985,728 A | | 11/1999 | Jennings | 438/311 |
| 5,998,292 A | | 12/1999 | Black et al. | 438/618 |
| 6,013,936 A | | 1/2000 | Colt, Jr. | 257/506 |
| 6,084,271 A | | 7/2000 | Yu et al. | 257/351 |
| 6,242,320 B1 | * | 6/2001 | So | 438/406 |
| 6,468,880 B1 | * | 10/2002 | Lim et al. | 438/459 |

FOREIGN PATENT DOCUMENTS

| JP | 09129724 A | * | 5/1997 | H01L/21/762 |
|---|---|---|---|---|
| JP | 10022378 A | * | 1/1998 | H01L/21/762 |

OTHER PUBLICATIONS

Oi (JP 10022378) (Translation).*
Fujii et al. (JP 09129724 (Translation).*

* cited by examiner

*Primary Examiner*—Amir Zarabian
*Assistant Examiner*—Maria Guerrero
(74) *Attorney, Agent, or Firm*—George O. Saile; Rosemary L.S. Pike; William J. Stoffel

(57) ABSTRACT

A method to form SOI devices using wafer bonding. A first substrate is provided having trenches in a first side. A first insulating layer is formed over the first side of the first substrate and filling the trenches. We planarize the first insulating layer to form isolation regions (e.g., STI). The three embodiments of the invention planarize the first insulating layer to different levels. In the second embodiment, the first insulating layer is etched back to form a recess. This recess later forms an air gap. We provide a second substrate having a second insulating layer over a first side of the second substrate. We bond the second insulating layer to the first insulating layer. Next, we thin the first substrate from the second side to expose the first insulating layer to form active areas between the isolation regions. Lastly, devices are formed in and on the active areas.

33 Claims, 6 Drawing Sheets

METHOD FOR FABRICATING SOI DEVICES WITH OPTION OF INCORPORATING AIR-GAP FEATURE FOR BETTER INSULATION AND PERFORMANCE

BACKGROUND OF INVENTION

1. Field of the Invention

This invention relates generally to fabrication of semiconductor devices and more particularly to the fabrication of silicon on insulator (SOI) devices and more particularly to a method for fabricating complementary silicon on insulator (CSOI) devices that can be partially depleted and fully depleted using wafer bonding and more particularly to a method for forming optional air gaps in insulating regions in silicon on insulator (SOI) devices.

2. Description of the Prior Art

Integrated circuits (ICs) include a multitude of transistors formed on a semiconductor substrate. Transistors, such as, metal oxide semiconductor field effect transistors (MOSFETs), are generally bulk semiconductor-type devices or silicon-on-insulator (SOI)-type devices.

The removal of portions of the first substrate can comprises a grinding process, an etching process (KOH) or a SMART CUT process; a process comprising a $H_2$ implant and anneal.

According to conventional complimentary metal oxide semiconductor (CMOS) fabrication techniques, the reduction of the depletion layer thickness is realized by a super-steep retrograded well (SSRW) ion implantation process. However, this process is limited by the diffusion of dopant atoms during subsequent thermal processes (e.g., annealing).

Conventional SOI-type devices include an insulative substrate attached to a thin film semiconductor substrate which contains transistors similar to the MOSFET described with respect to bulk semiconductor-type devices. The transistors have superior performance characteristics due to the thin film nature of the semiconductor substrate and the insulative properties of the insulative substrate. The superior performance is manifested in superior short channel performance (i.e., resistance to process variation in small size transistor), near-ideal subthreshold voltage swing (i.e., good for low off-state current leakage), and high saturation current.

Silicon on insulator (SOI) devices have been dubbed as the next successor to the reigning Complementary Metal On Silicon (CMOS) devices. Silicon on insulator (SOI) has excellent isolation properties. Silicon on insulator (SOI) has existed for almost two decades, but still improved methods for making silicon on insulator (SOI) devices are needed to advance the technology.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 4,169,000(Riseman) shows a STI air gap and a wafer bonded thereover. U.S. Pat. No. 6,084,271(Yu et al.) shows a silicon on insulator (SOI) process with wafer bonding and shallow trench isolation (STI). U.S. Pat. No. 5,988,292 (Black et al.) teaches a method to join multiple wafer using STI and wafer bonding. U.S. Pat. No. 5,985,728(Jennings) shows a SOI process with wafer bonding and a boron layer. U.S. Pat. No. 6,013,936(Colt, Jr.) teaches a double SOI device. U.S. Pat. No. 5,484,738(Chu et al.) teaches a Bonded SOI device/process.

SUMMARY OF THE INVENTION

It is an object of the present invention to provide a method to form a silicon on insulator (SOI) device.

It is an object of the present invention to provide a method to form a silicon on insulator (SOI) device that uses wafer bonding technique.

It is an object of the present invention to provide a method to form a silicon on insulator (SOI) device that uses wafer bonding technique that can be use to form fully and partially depleted complementary devices.

It is another object of the invention to provide a method to form a silicon on insulator device that uses wafer bonding techniques that can be used to make fully and partially depleted complementary devices with optional air gaps in insulating regions.

To accomplish the above objectives, the present invention provides a method of manufacturing a SOI device.

A first substrate is provided having trenches in a first side. The first substrate has a second side. A first insulating layer is formed over the first side of the first substrate and filling the trenches. We planarize the first insulating layer to from isolation regions (e.g., STI). The three embodiments of the invention planarize the first insulating layer to different levels. In the second embodiment, the first insulating layer is etched back to form a recess. This recess later forms an air gap. We provide a second substrate having a second insulating layer over a first side of the second substrate. The second substrate has a second side. We bond the second insulating layer to the first insulating layer. Next, we thin the first substrate from the second side to expose the first insulating layer to form active areas between the isolation regions. Lastly, devices are formed in and on the active areas.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1, 2B, 3, 4B, 5 and 6B are cross sectional views for illustrating a second embodiment of the method for manufacturing a SOI device according to the present invention.

FIGS. 1, 2C, 3, 4C, and 6C are cross sectional views for illustrating a third embodiment of the method for manufacturing a SOI device according to the present invention.

DETAILED DESCRIPTION OF THE PREFERRED EMBODIMENTS

The present invention will be described in detail with reference to the accompanying drawings. The present invention provides a method of forming a The invention had three preferred embodiments. The three embodiment differ in the amount of oxide 20 that is removed (see FIGS. 2A, 2b, and 2C).

Figure 6A:
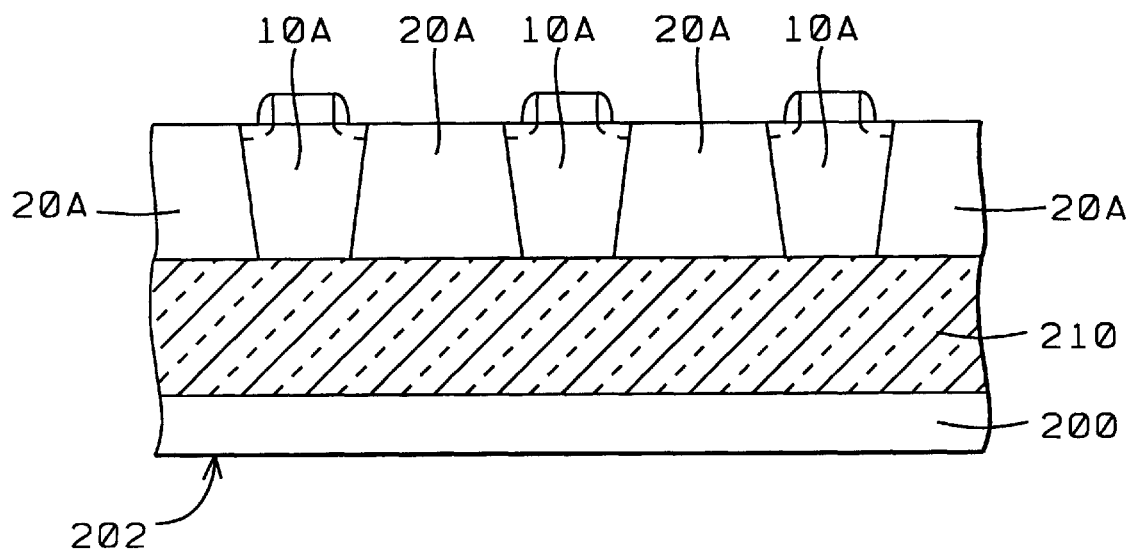

The first embodiment is shown in FIG. 6A. The first embodiment forms a SOI device without air gaps and without a buried oxide layer.

The second embodiment forms a SOI device with air gaps. See FIG. 6B. The second embodiment is similar to the first embodiment, but forms a gap 16 between the first substrate 10 and the insulating layer 210. See FIGS. 2B and 4B. The second embodiment etches back the first substrate 10 after the STI regions 20B are formed. See FIG. 2b.

The third embodiment (See FIG. 6C) forms a SOI device with a buried oxide layer 20C between the active area 10C and the oxide layer 210.

A. First Embodiment

The final result of the first embodiment is shown in FIG. 6A.

FIGS. 1, 2A, 3, 4A, and 6A are cross sectional views for illustrating a first embodiment of the method a for manufacturing a SOI device according to the present invention.

Figure 1:
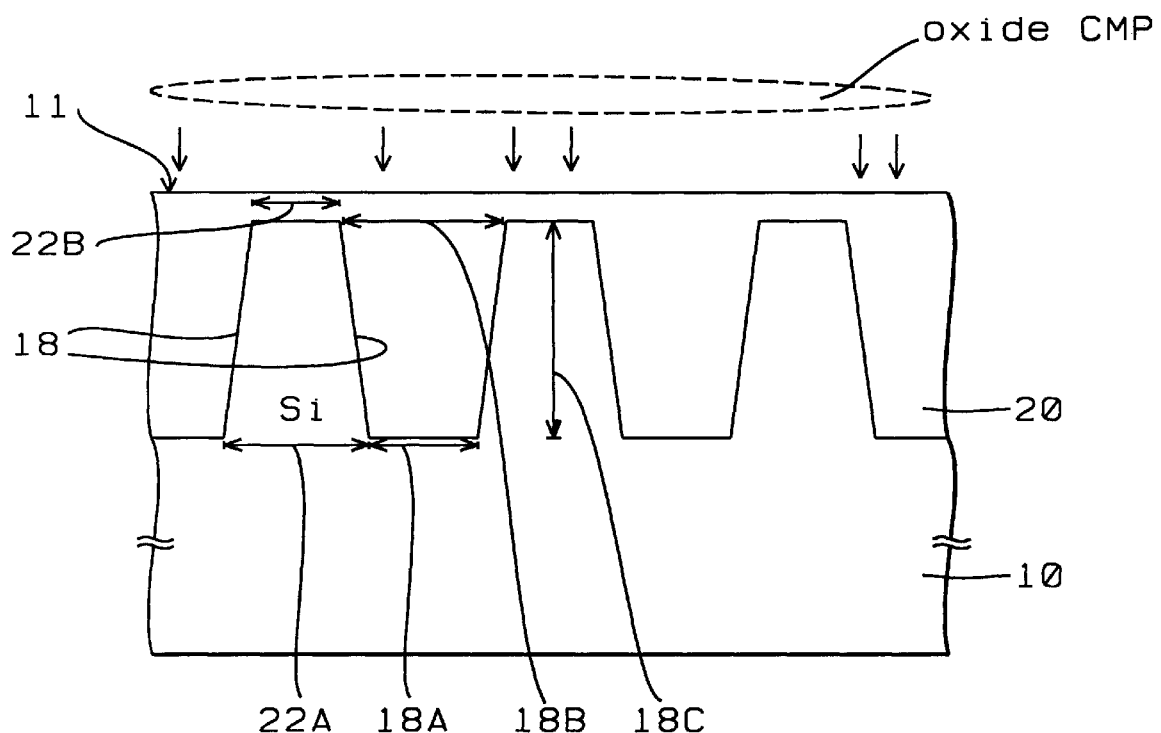
FIGS. 1, 2A, 3, 4A, and 6A are cross sectional views for illustrating a first embodiment of the method for manufacturing a SOI device according to the present invention.

As shown in FIG. 1, a first substrate 10 is provided having trenches 18 in a first side 11. The first substrate 10 have a second side 12.

The first substrate 10 is preferably comprised of monocrystalline silicon. The first substrate 10 is preferably comprised of monocrystalline silicon with a p-type doping of approximately 1E16 atom/cc. However, a substrate (e.g., wafer) with a different doping concentration and/or N-type doping could be used, depending on the final device requirements.

The trenches 18 preferably have a top width 18B between 0.35 μm and greater than 10 μm. and more preferably between 0.35 μm and 10 μm. The trenches 18 preferably have a bottom width 18A between 0.30 and greater than 10 μm and more preferably between 0.3 μm and 10 μm (depending on the low-out & depth of trench). The trenches 18 preferably have a depth 18C between 800 and 3000 Å.

The first substrate (e.g., active area) between the top of the trenches 18 preferably has a width 22B between 0.50 and 100 μm and the first substrate between the bottom of the trenches has a width 22A between 0.6 μm and 100 μm.

Still referring to FIG. 1, we form a first insulating layer 20 over the first side 11 of the first substrate and filling the trenches 18. The first insulating layer is preferably comprised of oxide and has a thickness of between about 800 (for fully depleted SOI) and 3000 (for partially depleted SOI) Å (after planarization).

Figure 2A:
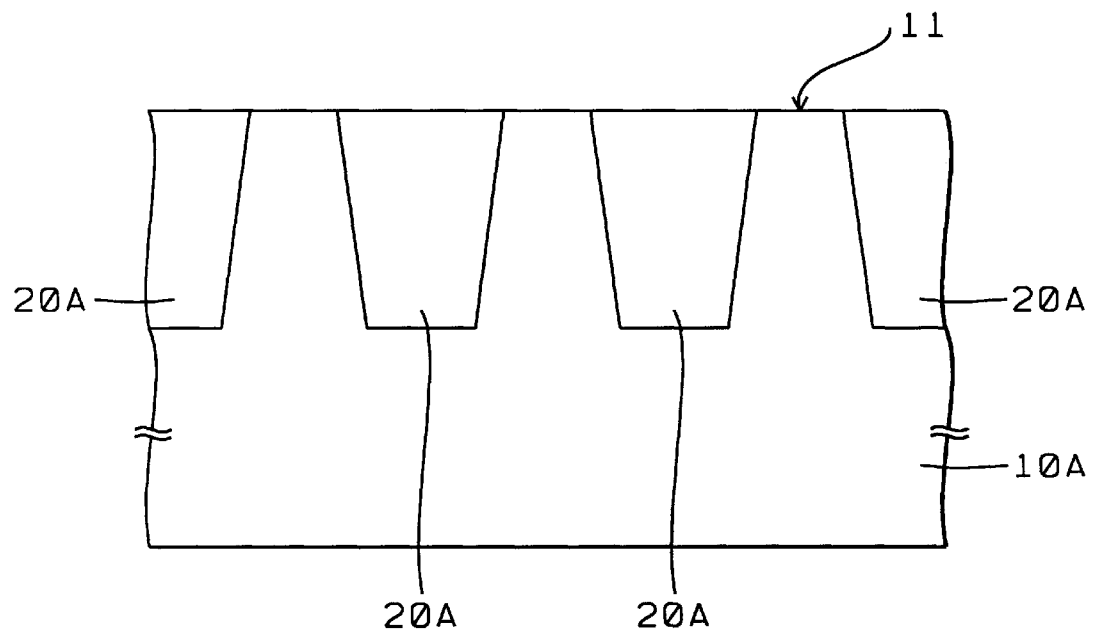

As shown in FIG. 2A, the first insulating layer 20 is planarized to expose the first side 11 of the first substrate 10 to form isolation regions (e.g., STI) 20A.

Figure 3:
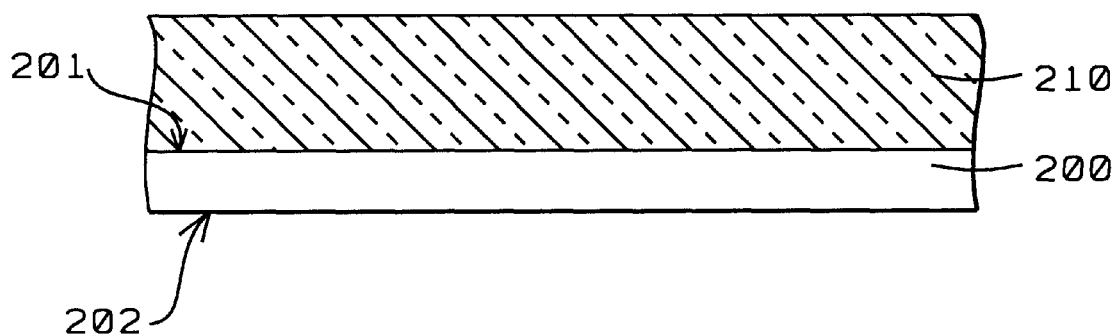

As shown in FIG. 3, we provide a second substrate 200 having a second insulating layer 210 over a first side 201 of the second substrate. The second substrate has a second side 202. The second substrate is composed of Si similarly to the first substrate.

The second insulating layer 210 is comprised of oxide and has a thickness of between about 1000 and 10,000 Å. The second substrate is comprised of monocrystalline silicon and has a thickness of between about 500 and 700 μm.

Figure 4A:
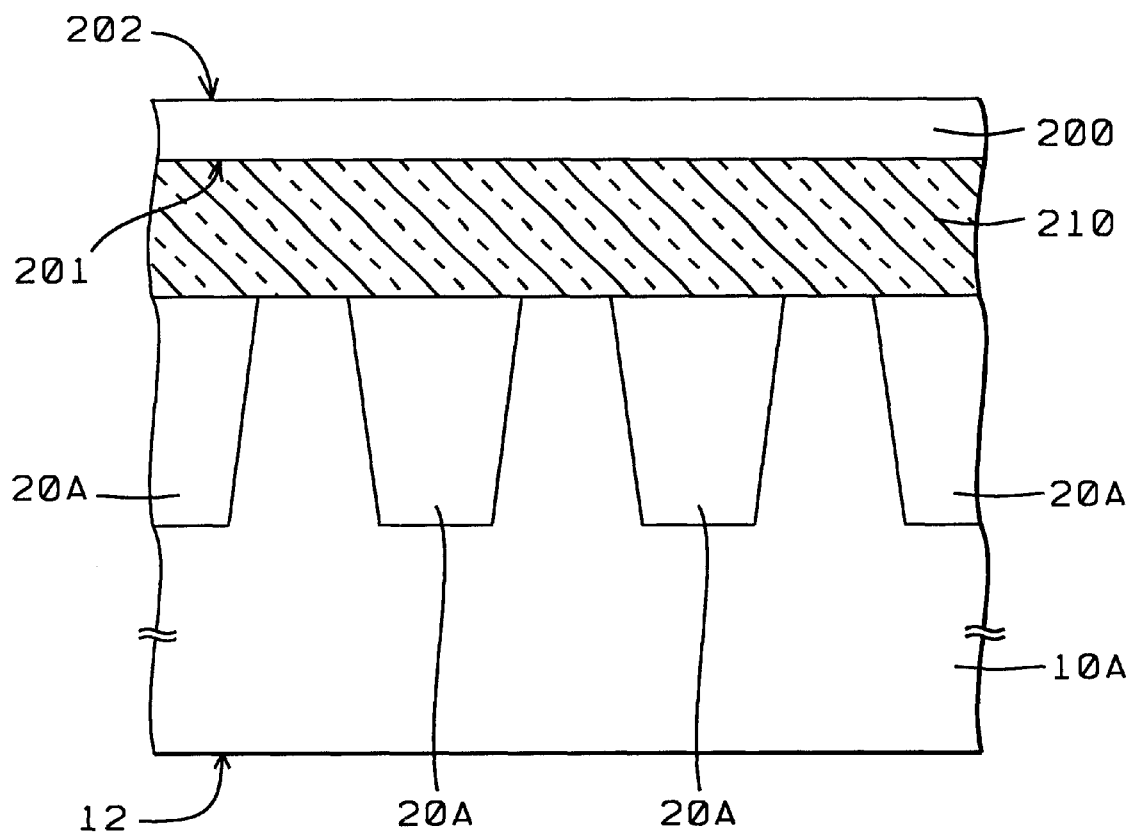

As shown in FIG. 4A, we bond the second insulating layer 210 to the first insulating layer 20A.

Next, we thin the first substrate from the second side 12. We remove portions of the first substrate 10 from the second side 12 to expose the first insulating layer 20 to form active areas 10a between the isolation regions 20A.

The removal of portions of the first substrate can comprises a grinding process, an etching process (KOH) or a SMART CUT process; a process comprising a H₂ implant and anneal. A SMART CUT process preferably comprises implanting H₂ into a wafer and annealing the wafer at about greater than 1000° C. The wafer will break into two at the implant depth/level.

Next, we preferably thermally anneal the active areas 10A thereby removing defects in the active areas 10A. The thermal anneal is preferably performed at a temperature between 1200 and 1400° C. for a time between 10 and 30 minutes.

As shown in FIG. 6A, devices can be fabricated in these regions using conventional process steps dictated by the type or types of devices desired. As shown in FIG. 6a, we form devices in and on the active areas 10a. In addition, the active areas can be doped to form N-well and or p-well so that NMOS and PMOS (or PFET and NFET) devices. Obviously, other devices can be formed in and on the active regions, such as resistors and capacitors.

B. Second Embodiment

The second embodiment is similar to the first embodiment, but forms a gap 16 between the first substrate 10 and the insulating layer 210. See FIGS. 2B and 4B. The second embodiment etches back the first substrate 10 after the STI regions 20B are formed. See FIG. 2b. The description above for the first embodiment applies to the second and third embodiments with the exception of the formation of the gap 16.

Figure 6B:
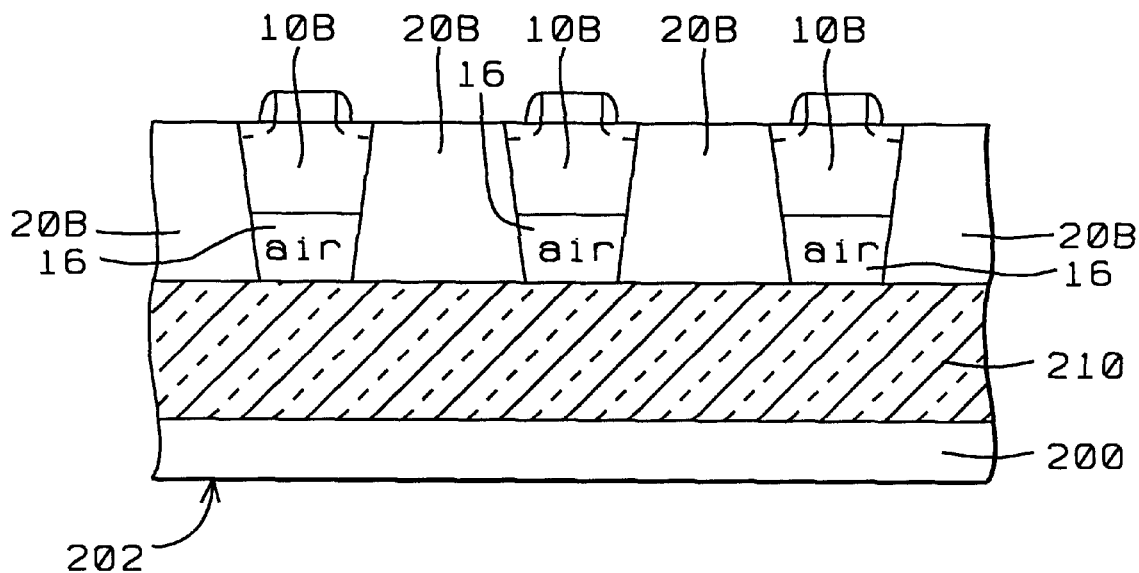

The final result of the second embodiment is shown in FIG. 6b. FIGS. 1, 2B, 3, 4B, 5 and 6B are cross sectional views for illustrating a second embodiment of the method a for manufacturing a SOI device according to the present invention.

As shown in FIG. 1, a first substrate 10 is provided having trenches 18 in a first side 11. The first substrate 10 has a second side 12.

The first substrate 10 is preferably comprised of monocrystalline silicon. The first substrate 10 is preferably comprised of monocrystalline silicon with a p-type doping of approximately 1E16 atom/cc. However, a substrate (e.g., wafer) with a different doping concentration and/or N-type doping could be used, depending on the final device requirements.

The trenches 18 preferably have a top width 18B between 0.35 and greater than 10 μm and more preferably between 0.35 and 10 μm; and a bottom width 18A between 0.3 and than 10 μm and more preferably between 0.30 and 10 μm. The trenches 18 preferably have a depth 18C between 800 and 3000 Å.

The first substrate between the top of the trenches having a width 22B between 0.35 and 100 μm and more preferably between 0.35 and 10 μm; and the first substrate between the bottom of the trenches having a width 22A between 0.6 μm and 100 μm and more preferably between 0.6 and 10 μm.

Still referring to FIG. 1, we form a first insulating layer 20 over the first side 11 of the first substrate and filling the trenches 18. The first insulating layer is preferably comprised of oxide and has a thickness of between about 800 (for fully depleted SOI (~no body Si) devices and 3000 Å (for partially depleted SOI) after planarization.

Figure 2B:
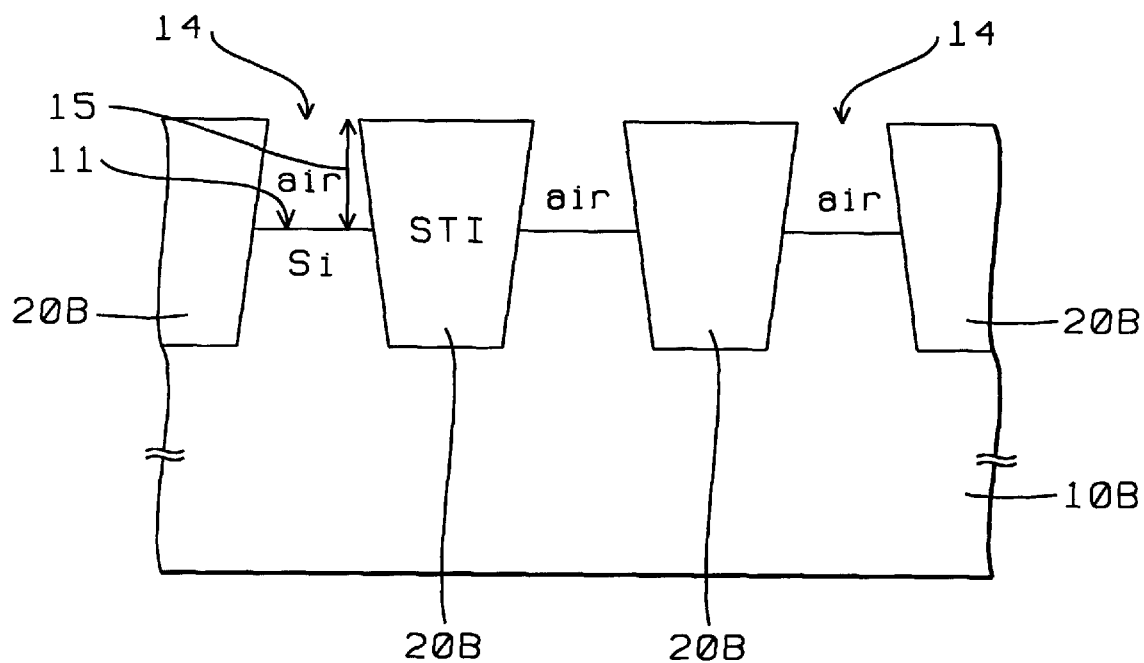

As shown in FIG. 2B, the first insulating layer 20 is planarized to expose the first side 11 of the first substrate 10 to form isolation regions (e.g., STI) 20b.

As shown in FIG. 2b, in a critical step, we remove portions of the first side 10 of the first substrate 10 to form recesses 14 between the isolation regions (e.g., STI) 20b. This is a major difference between the second embodiment and the first embodiments.

The recesses 14 preferably have a depth 15 between about 200 and 1500 Å. This is intended to ensure total isolation so that there is no conduction across the oxide.

As shown in FIG. 3, we provide a second substrate 200 having a second insulating layer 210 over a first side 201 of the second substrate. The second substrate has a second side 202. The second substrate is composed of Si similarly to the first substrate.

Figure 4B:
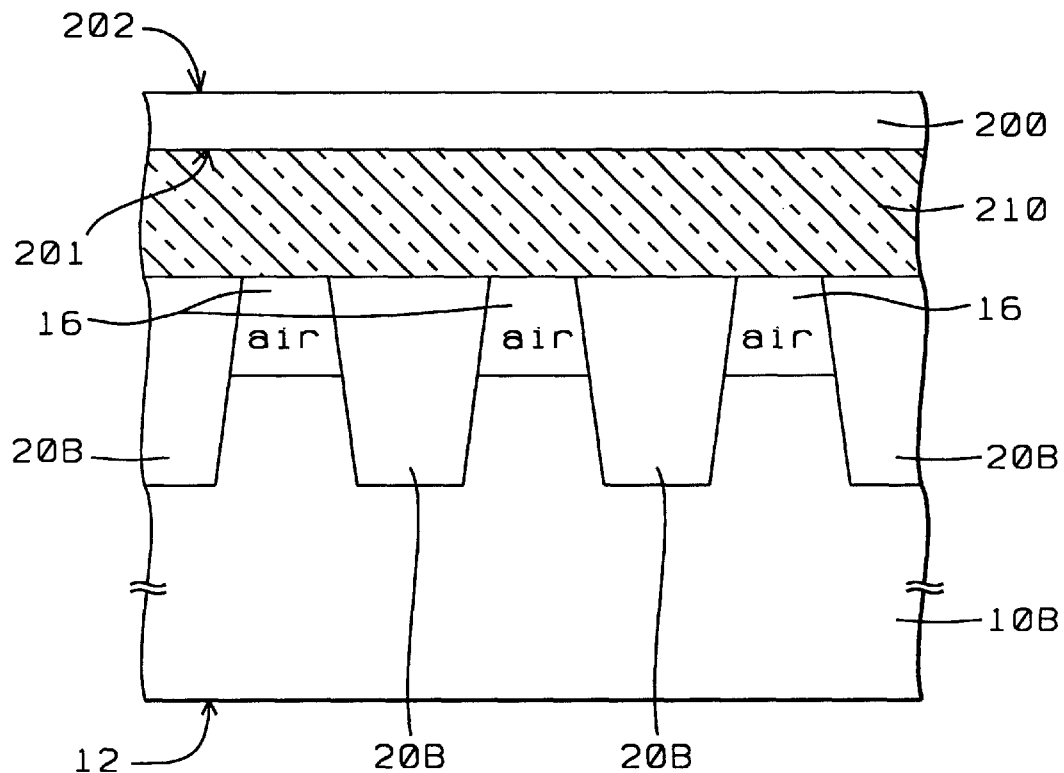

As shown in FIG. 4B, we bond the second insulating layer 210 to the first insulating layer 20A to form (air) gaps 16 between the second insulating layer 210 and the first substrate 10B.

As shown in FIG. 5B, we thin the first substrate 10 from the second side 12. We remove portions of the first substrate 10 from the second side 12 to expose the first insulating layer 20 to form active areas 10b between the isolation regions 20b.

The removal of portions of the first substrate can be performed by a grinding process, an etching process (KOH) or a SMART CUT process; a process comprising a $H_2$ implant and anneal.

Next, we thermally anneal the active areas 10A thereby removing defects in the active areas 10A. The thermal anneal is preferably performed at a temperature between 1200° C. and 1400° C. for a time between 10 and 30 minutes.

As shown in FIG. 6B, devices can be fabricated in these regions using conventional process steps dictated by the type or types of devices desired. As shown in FIG. 6b, we form devices in and on the active areas 10b. In addition, the active areas can be doped to form N-well and or p-well so that NMOS and PMOS (or PFET and NFET) devices. Obviously, other devices can be formed in and on the active regions, such as resistors and capacitors.

C. Third Embodiment

The third embodiment is similar to the first embodiment, but leaves a thickness of the insulating layer 20C between the active area 10C and the insulating layer 210. See FIG. 6C. In a critical step shown in FIG. 2C, the second embodiment planarizes the back the insulating layer 20C to not expose the first substrate 10. The description above for the first embodiment applies to the second and third embodiments with the exception of the formation of the gap 16.

Figure 6C:
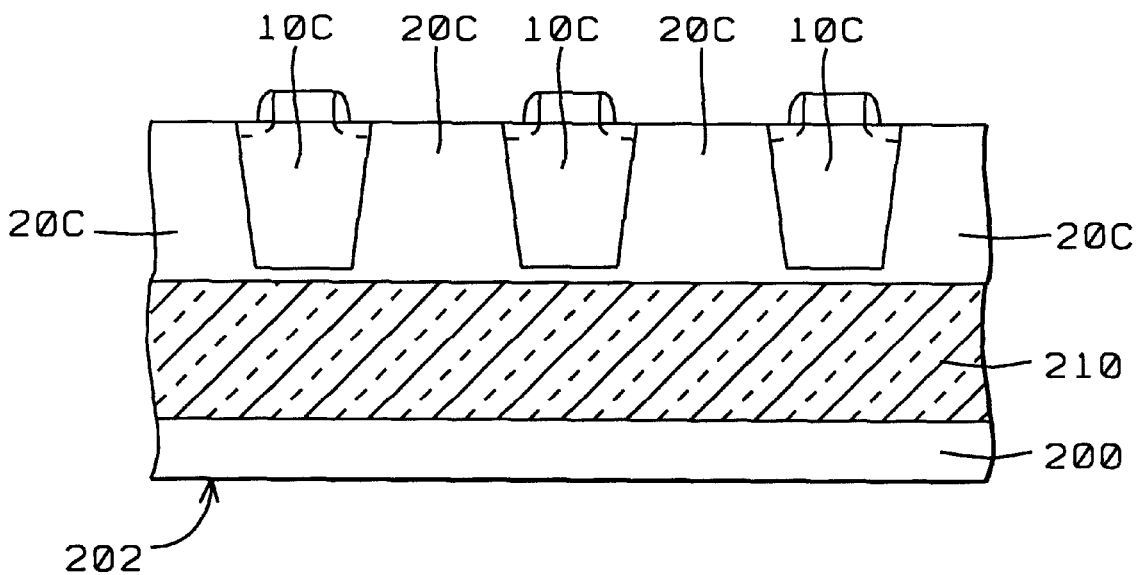

The final result of the third embodiment is shown in FIG. 6c. FIGS. 1, 2C, 3, 4C, and 6C are cross sectional views for illustrating a third embodiment of the method a for manufacturing a SOI device according to the present invention.

As shown in FIG. 1, a first substrate 10 is provided having trenches 18 in a first side 11. The first substrate 10 have a second side 12.

The first substrate 10 is preferably comprised of monocrystalline silicon. The first substrate 10 is preferably comprised of monocrystalline silicon with a p-type doping of approximately 1E16 atom/cc. However, a substrate (e.g., wafer) with a different doping concentration and/or N-type doping could be used, depending on the final device requirements.

The trenches 18 preferably have a top width 18B between 0.35 μm and greater than 10 μm. and more preferably between 0.35 μm and 10 μm; and a bottom width 18A between 0.60 and greater than 10 μm and more preferably between 0.6 μm and 10 μm. The trenches 18 preferably had depth 18C between 800 and 3000 Å.

The first substrate between the top of the trenches having a width 22B between 50 and 100 μm and the first substrate between the bottom of the trenches having a width 22A between 0.6 μm and 100 μm.

Still referring to FIG. 1, we form a first insulating layer 20 over the first side 11 of the first substrate and filling the trenches 18. The first insulating layer is preferably comprised of oxide and has a thickness of between about 800 (fully depleted SOI) and 3000 (partially depleted SOI) Å.

Figure 2C:
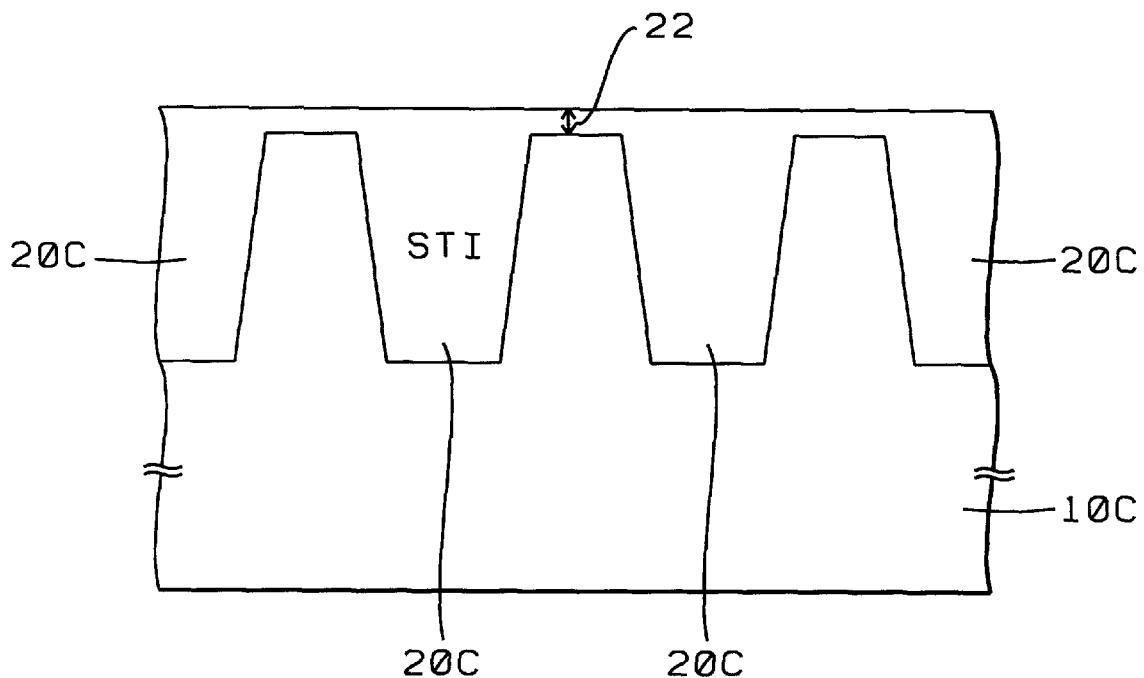

As shown in FIG. 2C, the first insulating layer 20C is planarized to not to expose the first side 11 of the first substrate 10 to form isolation regions (e.g., STI) 20c. The first insulating layer 20C preferably has a thickness 22 of between about 1000 and 3000 Å over the substrate 10C (after planarization).

As shown in FIG. 3, we provide a second substrate 200 having a second insulating layer 210 over a first side 201 of the second substrate. The second substrate has a second side 202. The second substrate is composed of Si similarly to the first substrate.

The second insulating layer 210 is comprised of oxide and has a thickness of between about 1000 and 7000 Å. The second substrate is comprised of monocrystalline silicon and has a thickness of between about 500 and 700 μm.

Figure 4C:
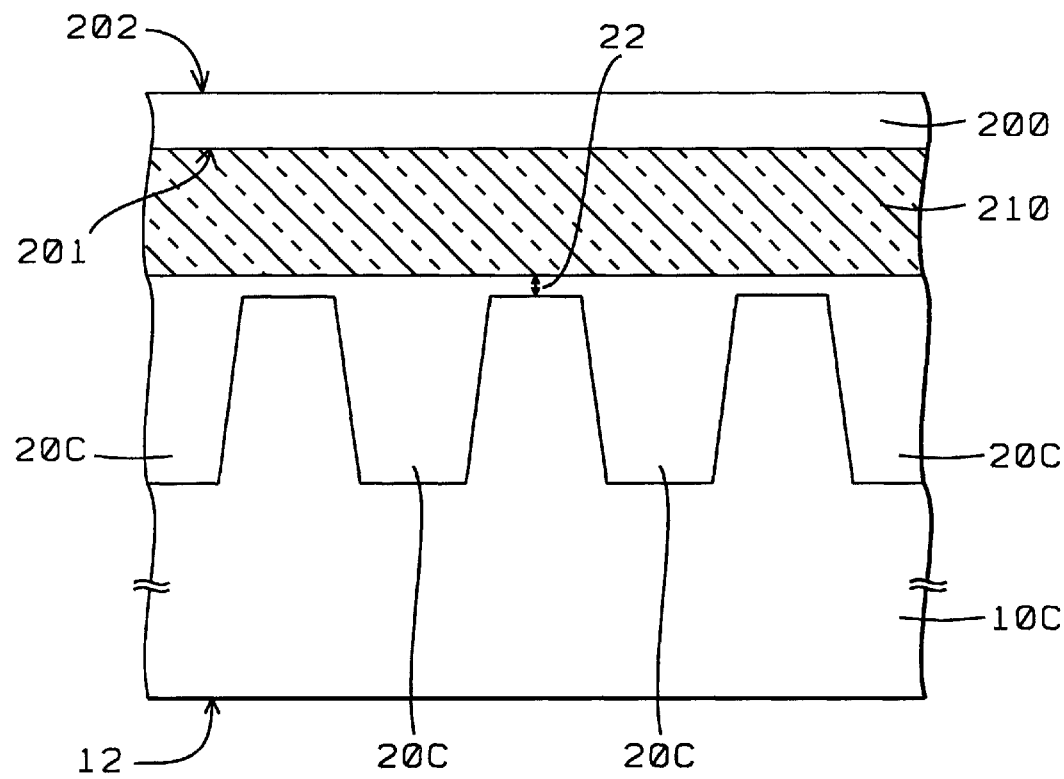
Figure 5:
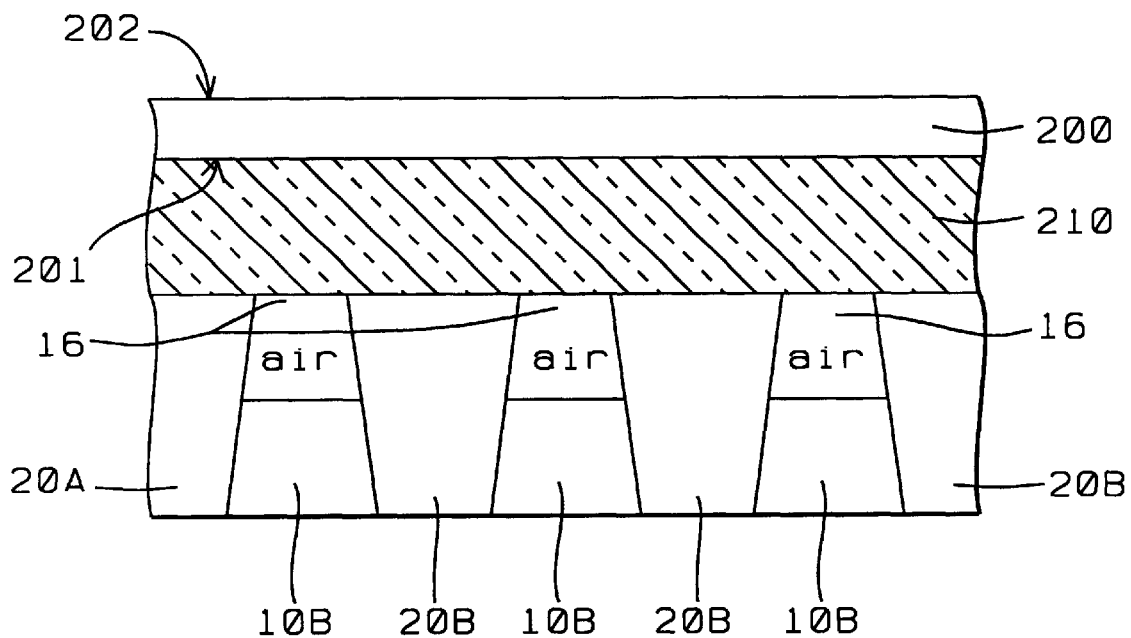

As shown in FIG. 4C, we bond the second insulating layer 210 to the first insulating layer 20c to form gaps 16 between the second insulating layer 210 and the first substrate 10c.

A shown in FIG. 6c, we thin the first substrate 10 from the second side 12. We removing portions of the first substrate 10C from the second side 12 to expose the first insulating layer 20C to form active areas 10C between the isolation regions 20c;

The removal of portions of the first substrate can comprises a grinding process, an etching process (KOH) or a smart cut process.

Next, we thermally anneal the active areas 10A thereby removing defects in the active areas 10A. The thermal anneal is preferably performed at a temperature between 1200 and 1400° C. for a time between 10 and 30 minutes.

As shown in FIG. 6c, devices can be fabricated in these regions using conventional process steps dictated by the type or types of devices desired. As shown in FIG. 6c, we form devices in and on the active areas 10c. In addition, the active areas can be doped to form N-well and or p-well so that NMOS and PMOS (or PFET and NFET) devices. Obviously, other devices can be formed in and on the active regions, such as resistors and capacitors.

Unless explicitly stated otherwise, each numerical value and range should be interpreted as being approximate as if the word about or approximately preceded the value of the value or range.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

Although this invention has been described relative to specific insulating materials, conductive materials and apparatuses for depositing and etching these materials, it is not limited to the specific materials or apparatuses but only to their specific characteristics, such as conformal and non-conformal, and capabilities, such as depositing and etching, and other materials and apparatus can be substituted as is well understood by those skilled in the microelectronics arts after appreciating the present invention While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a silicon on insulator (SOI) device; comprising the steps of:
    a) providing a first substrate having trenches in a first side; said first substrate has a second side;
    b) forming a first insulating layer over said first side of said first substrate and filling said trenches;
    c) planarizing said first insulating layer to expose said first side of said first substrate to form isolation regions;
    d) providing a second substrate having a second insulating layer over a first side of said second substrate; said second substrate having a second side;
    e) bonding said second insulating layer to said first insulating layer;
    f) removing portions of said first substrate from said second side to expose said first insulating layer to form active areas between said isolation regions; and
    g) forming devices in and on said active areas.

2. The method of claim 1 wherein said first substrate is comprised of monocrystalline silicon.

3. The method of claim 1 wherein said trenches have a top width greater than 0.35 µm and a bottom width greater than 0.3 µm.

4. The method of claim 1 wherein the first substrate between said top of said trenches having a width between 0.5 and 100 µm and the first substrate between said bottom of said trenches having a width between 0.6 and 100 µm and said trenches have depth between 800 and 3000 Å.

5. The method of claim 1 wherein said first insulating layer is comprised of oxide and has a thickness of between about 800 and 3000 Å.

6. The method of claim 1 wherein said second insulating layer is comprised of oxide and has a thickness of between about 1000 and 7000 Å.

7. The method of claim 1 wherein said second substrate is comprised of monocrystalline silicon and has a thickness of between about 500 and 700 Å.

8. The method of claim 1 wherein the removal of portions of said first substrate comprises a grinding process.

9. The method of claim 1 wherein the removal of portions of said first substrate comprises an etching process of KOH.

10. The method of claim 1 wherein the removal of portions of said first substrate comprises a process comprising a hydrogen implant and anneal.

11. A method of fabrication of a silicon on insulator (SOI) device; comprising the steps of:
    a) providing a first substrate having trenches in a first side; said first substrate has a second side;
        (1) said first substrate is comprised of monocrystalline silicon;
        (2) said trenches have a top width greater than 0.35 µm and a bottom width greater than 0.3 µm;
        (3) the first substrate between said top of said trenches having a width between 0.5 and 100 µm and the first substrate between said bottom of said trenches having a width between 0.6 and 100 µm;
    b) forming a first insulating layer over said first side of said first substrate and filling said trenches;
    c) planarizing said first insulating layer to expose said first side of said first substrate and to form isolation regions comprised of said first insulating layer;
        (1) said first insulating layer is comprised of oxide and has at thickness of between about 800 and 3000 Å;
    d) providing a second substrate having a second insulating layer over a first side of said second substrate; said second substrate having a second side;
        (1) said second insulating layer is comprised of oxide and has a thickness of between about 1000 and 7000 Å;
        (2) said second substrate is comprised of monocrystalline silicon and has a thickness of between about 500 and 700 Å;
    e) bonding said second insulating layer directly to said first insulating layer;
    f) removing portions of said first substrate from said second side to expose said first insulating layer to form active areas between said isolation regions; said active areas comprised of remaining portions of said first substrate;
        (1) the removal of portions of said first substrate comprises a grinding process, or an etching process of KOH, or a process comprising a hydrogen implant and anneal;
        (2) thermally annealing said active areas thereby removing defects in said active areas; the thermal anneal is performed at a temperature between 1200 and 1400° C. for a time between 10 and 30 minutes;
    g) forming devices in and on said active areas.

12. A method of fabrication of a silicon on insulator device; comprising the steps of:
    a) providing a first substrate having trenches in a first side; said first substrate has a second side;
    b) forming a first insulating layer over said first side of said first substrate and filling said trenches;
    c) planarizing said first insulating layer to expose said first side of said first substrate and to form isolation regions comprised of said first insulating layer;
    d) removing portions of said first side of said first substrate to form recesses between said isolation regions;
    e) providing a second substrate having a second insulating layer over a first side of said second substrate; said second substrate having a second side;
    f) bonding said second insulating layer directly to said first insulating layer to form gaps between said second insulating layer and said first substrate;
    g) removing portions of said first substrate from said second side to expose said first insulating layer to form active areas between said isolation regions; said active areas comprised of remaining portions of said first substrate; and
    h) forming devices in and on said active areas.

13. The method of claim 12 wherein said first substrate is comprised of monocrystalline silicon.

14. The method of claim 12 wherein said trenches have a top width greater than 0.35 µm and a bottom width greater than 0.3 µm.

15. The method of claim 12 wherein the first substrate between said top of said trenches having a width between 0.5 and 100 µm and the first substrate between said bottom of said trenches having a width between 0.6 and 100 µm.

16. The method of claim 12 wherein said first insulating layer is comprised of oxide and has at thickness of between about 800 and 3000 Å.

17. The method of claim 12 wherein said recesses have a depth between about 1500 Å.

18. The method of claim 12 wherein said second insulating layer is comprised of oxide and has a thickness of between about 1000 and 7000 Å.

19. The method of claim 12 wherein said second substrate is comprised of monocrystalline silicon and has a thickness of between about 500 and 700 Å.

20. A method of fabrication of a silicon on insulator device; comprising the steps of:
 a) providing a first substrate having trenches in a first side; said first substrate has a second side;
  (1) said first substrate is comprised of monocrystalline silicon;
  (2) said trenches have a top width greater than 0.35 μm and a bottom width greater than 0.3 μm;
  (3) the first substrate between said top of said trenches having a width between 0.5 and 100 μm and the first substrate between said bottom of said trenches having a width between 0.6 and 100 μm;
 b) forming a first insulating layer over said first side of said first substrate and filling said trenches;
 c) planarizing said first insulating layer to expose said first side of said first substrate and to form isolation regions comprised of said first insulating layer;
  (1) said first insulating layer said first insulating layer is comprised of oxide and has at thickness of between about 800 and 3000 Å;
 d) removing portions of said first side of said first substrate to form recesses between said isolation regions;
  (1) said recesses have a depth between about 200 and 1500 Å;
 e) providing a second substrate having a second insulating layer over a first side of said second substrate; second substrate having a second side;
  (1) said second insulating layer is comprised of oxide and has a thickness of between about 1000 and 7000 Å;
  (2) said second substrate is comprised of monocrystalline silicon and has a thickness of between about 500 and 700 Å;
 f) bonding said second insulating layer to said first insulating layer to form gaps between said second insulating layer and said first substrate;
 g) removing portions of said first substrate from said second side to expose said first insulating layer to form active areas between said isolation regions; said active areas are comprised of remaining portions of said first substrate;
  (1) the removal of portions of said first substrate comprises a grinding process, an etching process of KOH or a process comprising a hydrogen implant and anneal;
 h) thermally annealing said active areas thereby removing defects in said active areas; the thermal anneal is performed at a temperature between 1200 and 1400° C. for a time between 10 and 30 minutes; and
 i) forming devices in and on said active areas.

21. A method of fabrication of a silicon on insulator device; comprising the steps of:
 a) providing a first substrate having trenches in a first side; said first substrate has a second side;
 b) forming a first insulating layer over said first side of said first substrate and filling said trenches;
 c) planarizing said first insulating layer and not exposing said first side of said first substrate and to form isolation regions comprised of said first insulating layer;
 d) providing a second substrate having a second insulating layer over a first side of said second substrate; said second substrate having a second side;
 e) bonding said second insulating layer directly to said first insulating layer;
 f) removing portions of said first substrate from said second side to expose said first insulating layer to form active areas between said isolation regions; said active areas comprised of remaining portions of said first substrate; and
 g) forming devices in and on said active areas.

22. The method of claim 21 wherein said first substrate is comprised of monocrystalline silicon.

23. The method of claim 21 wherein said trenches have a top width greater than 0.6 μm and a bottom width greater than 10 μm.

24. The method of claim 21 wherein the first substrate between said top of said trenches having a width between 0.5 and 100 μm and the first substrate between said bottom of said trenches having a width between 0.6 and 100 μm.

25. The method of claim 21 wherein said first insulating layer said first insulating layer said first insulating layer is comprised of oxide and has at thickness of between about 800 and 3000 Å.

26. The method of claim 21 wherein said first insulating layer has a thickness of between about 1000 and 3000 Å.

27. The method of claim 21 wherein said second insulating layer is comprised of oxide and has a thickness of between about 1000 and 7000 Å.

28. The method of claim 21 wherein said second substrate is comprised of monocrystalline silicon and has a thickness of between about 500 and 700 Å.

29. The method of claim 21 wherein the removal of portions of said first substrate comprises a grinding process.

30. The method of claim 21 wherein the removal of portions of said first substrate comprises an etching process of KOH.

31. The method of claim 21 wherein the removal of portions of said first substrate comprises a process comprising a $H_2$ implant and anneal.

32. A method of fabrication of a silicon on insulator device; comprising the steps of
 a) providing a first substrate having trenches in a first side; said first substrate has a second side;
  (1) said first substrate is comprised of monocrystalline silicon;
  (2) said trenches have a top width greater than 0.35 μm and a bottom width greater than 0.3 μm;
  (3) the first substrate between said top of said trenches having a width between 0.5 and 100 μm and the first substrate between said bottom of said trenches having a width between 0.6 and 100 μm;
 b) forming a first insulating layer over said first side of said first substrate and filling said trenches;
  (1) said first insulating layer is comprised of oxide and has at thickness of between about 800 and 4000 Å;
 c) planarizing said first insulating layer and not exposing said first side of said first substrate to form isolation regions comprised of said first insulating layer;
  (1) said first insulating layer has a thickness of between about 1000 and 3000 Å over said first substrate between said trenches;
 d) providing a second substrate having a second insulating layer over a first side of said second substrate; said second substrate having a second side;
  (1) said second insulating layer is comprised of oxide and has a thickness of between about 1000 and 7000 Å;
  (2) said second substrate is comprised of monocrystalline silicon and has a thickness of between about 500 and 700 Å;

e) bonding said second insulating layer directly to said insulating layer;
f) removing portions of said first substrate from said second side to expose said first insulating layer to form active areas between said isolation regions; said active regions comprised of portions of said first substrate;
   (1) the removal of portions of said first substrate comprises a grinding process; or an etching process of KOH;
g) thermally annealing said active areas thereby removing defects in said active areas; the thermal anneal is performed at a temperature between 1200 and 1400°C. for a time between 10 and 30 minutes; and
h) forming devices in and on said active areas.

33. A method of fabrication of a silicon on insulator (SOI) device; comprising the steps of:
a) providing a first substrate having trenches in a first side; said first substrate has a second side;
b) forming a first insulating layer over said first side of said first substrate and filling said trenches;
c) planarizing said first insulating layer to expose said first side of said first substrate and to form isolation regions comprised of the remaining said first insulating layer;
d) providing a second substrate having a second insulating layer over a first side of said second substrate; said second substrate having a second side;
e) bonding said second insulating layer directly to said first insulating layer;
f) removing portions of said first substrate from said second side to expose said first insulating layer to form active areas between said isolation regions; said active areas are comprised of remaining portions of said first substrate; and
g) forming devices in and on said active areas.

* * * * *